United States Patent [19]

Niijima et al.

[11] Patent Number: 5,598,370

[45] Date of Patent: Jan. 28, 1997

[54] NONVOLATILE MEMORY WITH CLUSTER-ERASE FLASH CAPABILITY AND SOLID STATE FILE APPARATUS USING THE SAME

[75] Inventors: Hideto Niijima, Tokyo; Hideo Asano, Machida; Yoshinori Sakaue, Tokyo; Takashi Toyooka, Kawasaki, all of Japan

[73] Assignee: International Business Machines Corporation, Armonk, N.Y.

[21] Appl. No.: 429,395

[22] Filed: Apr. 26, 1995

Related U.S. Application Data

[62] Division of Ser. No. 200,343, Feb. 23, 1994.

[30] Foreign Application Priority Data

Feb. 24, 1993 [JP] Japan .................................. 5-035228

[51] Int. Cl.$^6$ .................................................. G11C 13/00
[52] U.S. Cl. ................................. 365/185.33; 365/218
[58] Field of Search ........................... 365/185.33, 218

[56] References Cited

U.S. PATENT DOCUMENTS 5,065,364  11/1991  Atwood et al. .................. 365/185.33

*Primary Examiner*—Terrell W. Fears
*Attorney, Agent, or Firm*—Matthew J. Bussan; Schmeiser, Olsen & Watts

[57] ABSTRACT

A nonvolatile memory-with cluster-erase flash capability. A cluster information sector is included in each of N clusters, the cluster information sector of each cluster being written with the sequence number assigned to the cluster so that no two clusters have the same sequence number. When erasing a given sector, a controller saves its sequence number prior to erasure. Then, when initializing a given erased sector, the controller sets its sequence number to a value greater than the current maximum sequence number. The controller writes user data to sectors other than the cluster information sector for the cluster thus initialized according to their address sequence. Accordingly, an invalid sector can be distinguished from a valid sector without using an overwrite approach.

10 Claims, 12 Drawing Sheets

NONVOLATILE MEMORY WITH CLUSTER-ERASE FLASH CAPABILITY AND SOLID STATE FILE APPARATUS USING THE SAME

This is a divisional of co-pending application Ser. No. 08/200,343 filed on Feb. 23, 1994.

BACKGROUND OF THE INVENTION

1. Field of the invention

The present invention relates to a nonvolatile memory with cluster-erase flash capability called a flash EEPROM (hereinafter referred to as a flash memory), and more particularly to a solid state file apparatus which can dynamically allocate sectors.

2. Description of Prior Art

As portable personal computers, such as notebook-types, have spread, the requirement for small-size, light weight, and low power consumption computer systems has increased. An external storage device or solid state file using solid state memories has a low power consumption and can operate at high speed because, unlike a magnetic disk apparatus, it does not have a mechanical drive system. Further, since it is composed of small memory modules, it is small in size, light in weight, and has a large degree of freedom with respect to shape as compared with a magnetic disk apparatus, and is also easily made in the form of a card.

However, the conventional solid state memory has many problems with respect to such points as cost, capacity, and battery backup. If SRAMs are used as the memory, the cost is high and hence the capacity becomes small though the backup time by a battery becomes long. For DRAMs, which are excellent in cost and capacity, the standby power consumption is large and the backup time is limited to one week or so. There is also a problem of data loss due to problems in the battery system. EEPROMs are costly though they require no battery.

A flash memory has been developed as a memory to solve these problems. Its memory element is composed of one transistor as a DRAM so that it can be packaged at high density, and it is expected to have a bit cost equivalent to or less than a DRAM (low cost, large capacity), depending on the future market. The memory element is nonvolatile and does not require battery backup. Erasure is generally performed for each chip for each smaller block. The outline of such a flash memory is introduced by Richard D. Pashley et al. in "Flash Memories: the best of two worlds," IEEE SPECTRUM, December 1989, pp. 30–33. As far as performance is concerned, the block erase type is superior to the chip erase type.

When the block erase type flash memory is used for a solid state file, it is convenient to memory management if the size of a block is made equal to a sector, which is a unit of access in the magnetic disk apparatus. European Patent. Application 392895, for example, discloses a flash EEPROM system of the sector erase type. The system makes it possible to simultaneously erase any plural sectors by providing a latch for each sector, which is a unit of erasure, and setting a latch corresponding to a sector to be erased. Also known is a flash memory whose unit of erasure is a block having a size equivalent to a plurality of sectors (e. g. 4K bytes). This is sometimes called the cluster erase type to distinguish it from the sector erase type.

However, the flash memory has limitations which SRAMs and DRAMs do not have. First, the programming of memory bits is a one-way process and change is allowed only from 0 to 1 or from 1 to 0. Therefore, when new data is to be written to a memory location which has already been written on, writing should be performed after a block including that memory location has been erased to the all 0 or all 1 state. It is usually takes from several tens of milliseconds to several seconds for erasure and writing. Further, the flash memory is deteriorated by erasure and writing and reaches a usage limit, at present, after several tens of thousands to several hundreds of thousands of erasures and writings.

If such a flash memory is used for a solid state file, a problem arises in that writing is based to a portion of the memory if the same logical sector is allocated to the same physical sector. For example, in a DOS-based personal computer system, a file allocation table (FAT) is frequently updated. However, since the FAT address is fixed, a block storing the FAT has to be erased and then written each time the FAT is updated, in the case of a flash memory, and it takes several tens of milliseconds to several seconds each time. If a particular block which is a portion of memory is frequently erased and written, that block reaches the use limit faster than other blocks, and therefore, the memory needs to be replaced even if the other blocks can still be used. Early replacement of the memory could be avoided if the block which has reached its use limit is invalidated and an alternative block is used instead. However, this means that a block on which writing is concentrated is merely changed to an alternative block, and therefore, does not provide a radical solution.

Then, Japanese Pat. Appln. No. 3-197318 has succeeded in solving these problems by employing dynamic sector allocation. The method is briefly described referring to FIGS. 1 and 2. An address translation table is created in a RAM. By referencing the table, an address (logical address) specified by the host processor is translated to an address (physical address) specifying a sector (physical sector) of a solid state file apparatus (SSF). That is, the host processor specifies a location to be written with data by a logical address consisting of a head number, a cylinder number, and a sector number. A physical address corresponding to the logical address is stored in an entry identified by a logical address in the address translation table. Each sector of the SSF to be specified by the physical address contains an area for storing a reverse reference pointer (RP) and an area for storing the status of the sector in addition to the data area for storing data.

Now, it is assumed that, when the SSF receives a write command regarding a logical address (H, C, S)=(1, 4, 5) from the host processor, a sector Y, which is empty until then, is allocated to the logical address. A controller of SSF writes data in the data area of the physical sector Y, and writes an RP area (1, 4, 5) to set the 'sector valid' flag in the status area. At the same time, a physical address ABC is written in an entry X in the translation table identified by the logical address (1, 4, 5). Thereafter, whenever reading of data from the logical address (1, 4, 5) is requested, the physical address ABC is accessed by using the address translation table (see FIG. 1).

When the SSF again receives from the host processor a write command to the logical address (H, C, S)=(1, 4, 5), the controller of SSF invalidates the physical data Y, and allocates a physical, which is empty until then, to the logical address (1, 4, 5). For example, the entry X in the address translation table is rewritten to ABD, data is written in the data area of a sector Z at the physical address ABD in the SSF, (1, 4, 5) is written in the RP area, and a flag is set in the status area indicating that it is valid. At the same time, a flag is set in the status area of the sector Y indicating that it is invalid.

Then, because the address translation table is lost when the system is turned off, it is required to be reconstructed when the system is turned on again. In such a case, the physical address of that sector is registered in an entry in the address translation table specified by the reverse reference pointer. If one or more sectors have the same RP as shown in FIG. 2, the physical addresses of valid sectors are registered. Thus, the valid/invalid information on a sector of the SSF is essential to the reconstruction of the address translation table which is the key to the dynamic allocation.

On the other hand, as described earlier, because data cannot be written in a sector contained in a block unless it is erased, it is generally difficult to update the status of sector. Against this problem, Pat. Appln. No. 3-197318 discloses a method in which the "blank," "valid," "invalid" or "being erased" state of each sector is indicated by changing the status flag bit from "1111"→"1110"→"1100"→"0000" based on the property of some of flash memories that, when the bit change is limited to only one direction, it is overwritable. However, some NAND type flash EEPROMs cannot be overwritten at all, to which the method using the status bit cannot be used.

SUMMARY OF THE INVENTION

The object of this invention is to provide a nonvolatile memory with cluster-erase flash capability for which the valid sectors can be found without using the overwriting method, and a solid state file apparatus using the same.

The nonvolatile memory with cluster-erase flash capability according to the present invention comprises N clusters, each comprising M sectors, wherein M and N are integers greater than one; each of said N clusters has a cluster information sector; sequence numbers are given to said N clusters in such a way that no two sectors have the same sequence number; and each cluster holds a sequence number given thereto in its cluster information sector. The solid state file apparatus according the present invention comprises such a nonvolatile memory with cluster-erase flash capability and a controller. To perform dynamic allocation, the controller maintains an area in a random access memory for an address translation table, selects a sector upon a write request from a processor, and writes a physical address of the selected sector into an entry of the address translation table as well as the given logical address into the selected sector as a reverse pointer.

When erasing a given cluster, the controller saves its sequence number in a nonvolatile storage area such as another cluster previous to the erasure. Then, when initializing a given erased cluster, the controller sets the sequence number of the given cluster to a value more than a current maximum sequence number.

The controller writes user data to sectors other than the cluster information sector for the cluster thus initialized according to their address sequence.

When the controller reconstructs the address translation table, it reads M×N sectors of the nonvolatile memory, and writes the physical addresses of those sectors into entries of the address translation table specified by their reverse pointer. If a plurality of sectors have the same reverse pointer, it writes the physical address of the most recently written sector into said address translation table according to the sequence number of the cluster to which it belongs and the position in the cluster.

When each cluster information sector is previously written with the erase counts of the clusters, including that cluster itself, and the maximum sequence number is set equal to the sum of the erase counts of all the clusters, the erase counts are saved together with the sequence number when erasing a cluster. Then, when an erased cluster is initialized, the erase count of that cluster already stored is increased, in a manner similar to the sequence number, and written back into the cluster information sector. When the address translation table is reconstructed, the maximum sequence number is checked for agreement with the sum of the erase counts of all the clusters by utilizing the fact that all cluster information sectors have been read. Thus, it can found whether the integrity of data is maintained.

DESCRIPTION OF THE PREFERRED EMBODIMENTS

Figure 1:
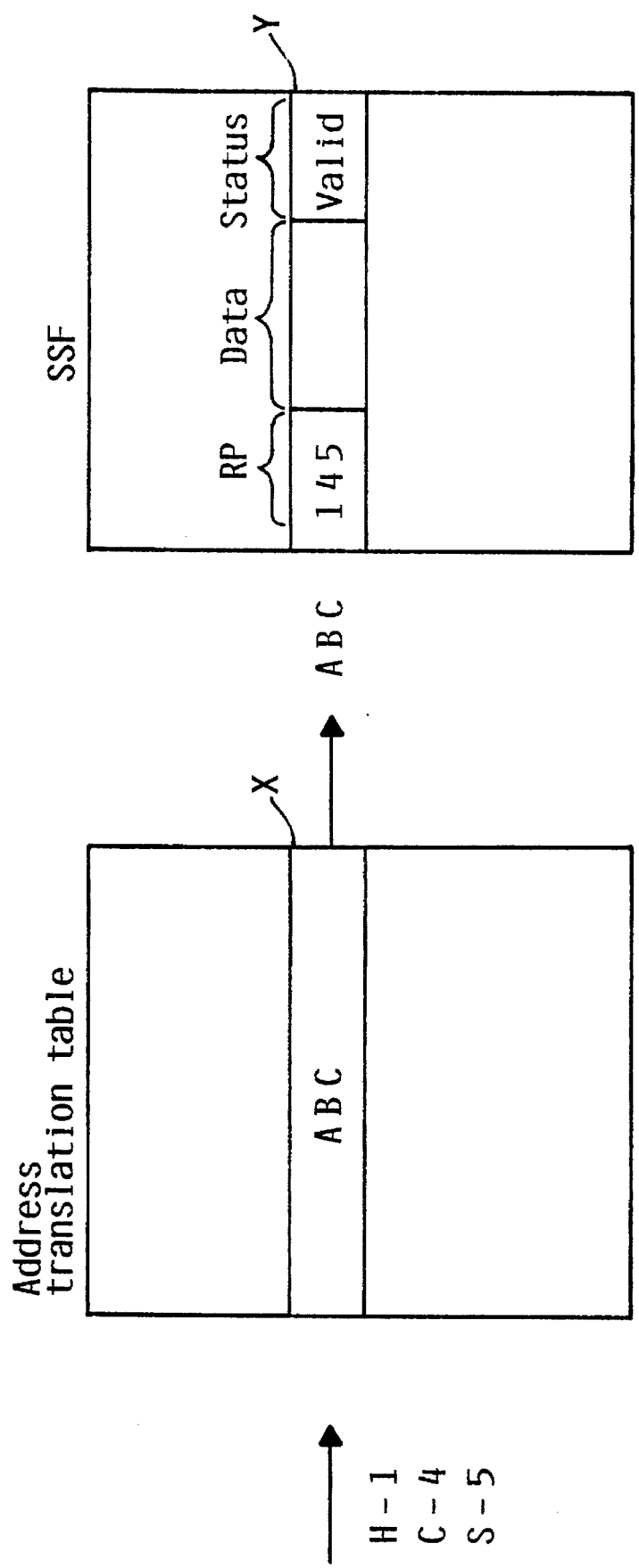
FIG. 1 is a diagram for explaining the dynamic sector allocation disclosed in Japanese Pat. Appln. No. 3-197318.
Figure 2:
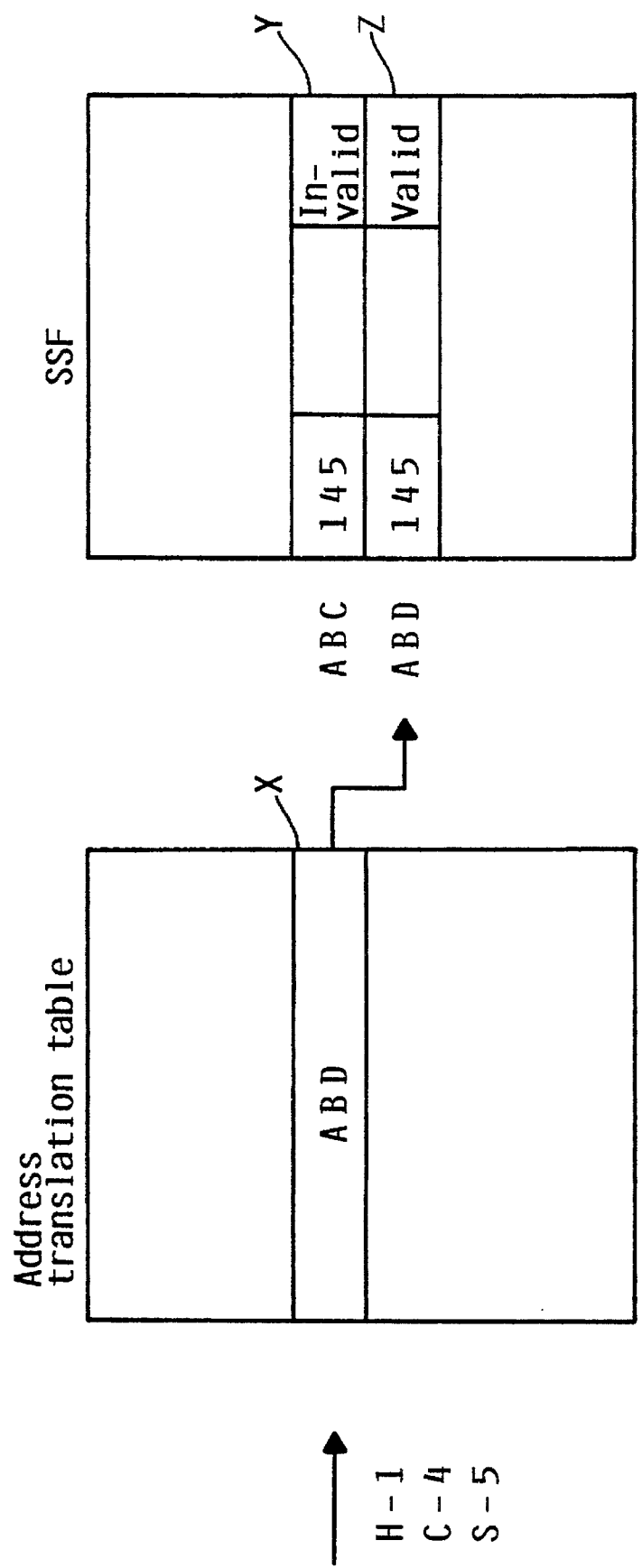
FIG. 2 is a diagram for explaining the dynamic sector allocation disclosed in Japanese Pat. Appln. No. 3-197318.
Figure 3:
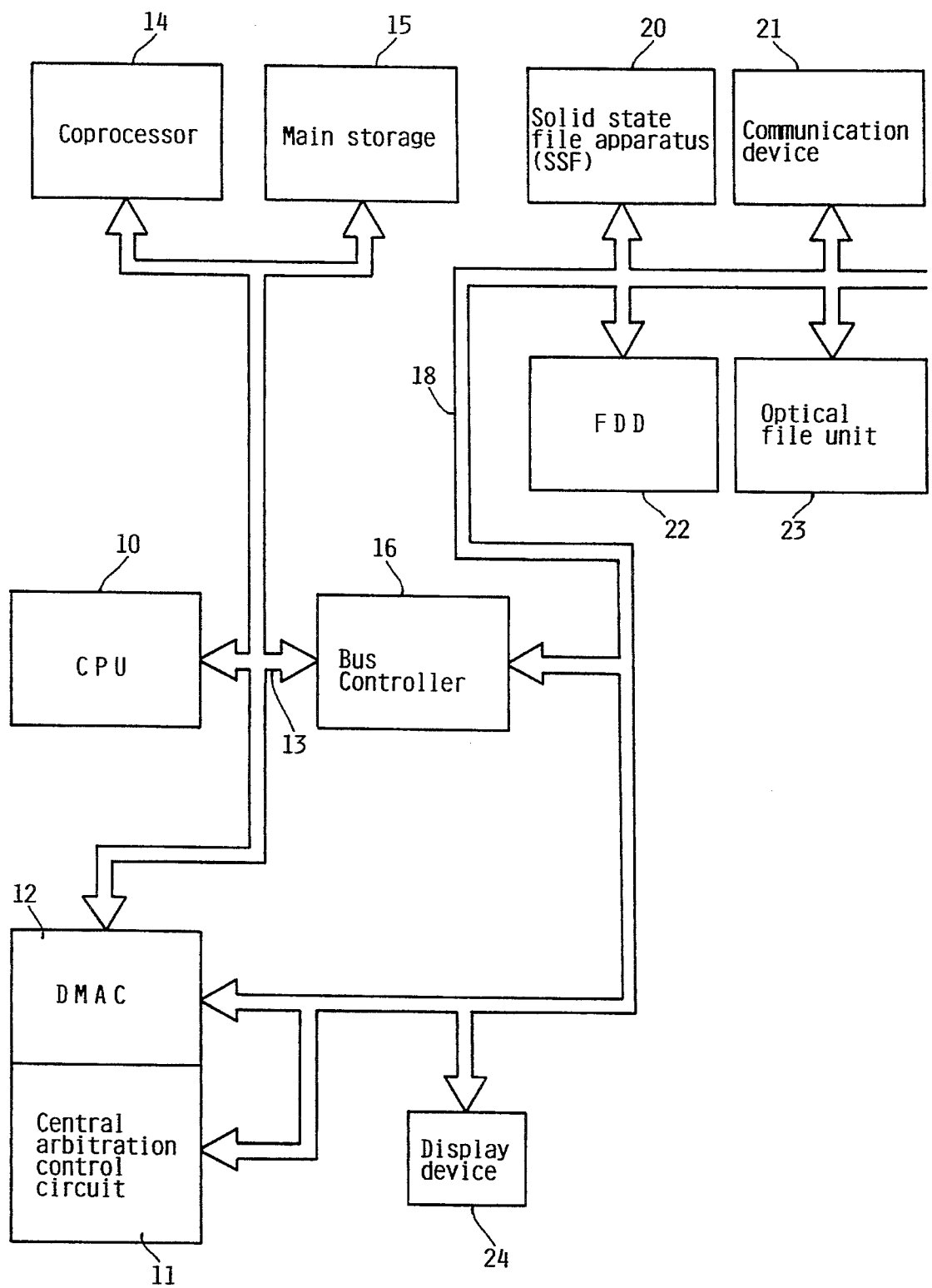
FIG. 3 is a block diagram showing an example of a computer system including a solid state file apparatus according to the present invention.

FIG. 3 shows an example of a computer system in which a flash memory according to the present invention is incorporated as a solid state file apparatus. A CPU 10 communicates, through a system bus 13, with a main storage 15, a bus controller 16, and an optional math coporocessor 14. Communications between the CPU 10 and peripheral equipment are performed through the bus controller 16. To this end, the bus controller 16 is connected, through a family bus 18, to the peripheral equipment. A solid state file apparatus (SSF) 20 made of the flash memory according to the present invention, a communication device 21, a floppy disk drive (FDD) 22, an optical file unit 23, and a display device 24 are connected to the family bus 18 as peripheral equipment. Of course, other peripheral equipment may also be connected. An example of such a computer system is the IBM PS/2 (registered trademarks of International Business Machines Corporation) personal computer.

A direct memory access controller (DMAC) 12 is provided to enable memory access by all or some selected peripheral equipment. To this end, at least a portion of the family bus 18 is branched to the DMAC 12. Each peripheral device which is allowed direct memory access (DMA) is provided with an arbitration circuit, though not shown in the drawing, and is assigned an arbitration level (priority). In association with the DMAC 12, a central arbitration control circuit 11 is provided which arbitrates among a plurality of peripheral equipment simultaneously making requests to DMA and informs the DMAC 12 which peripheral equipment is granted the DMA. Details of the DMA control by the DMAC 12 and the central arbitration control circuit 11 are described in U. S. Pat. No. 4,901,234.

The CPU 10 uses the SSF 20 as a hard disk drive. Therefore, when the SSF 20 is accessed, a relative block address (RBA) comprising a head number, a cylinder number, and sector number, is sent to the SSF 20. The SSF 20 performs dynamic sector allocation. Therefore, the relationship between the RBA provided by the CPU 10 and an address (physical address) of a block of the SSF 20, which is actually accessed, is not fixed and varies each time writing is performed. Then, an address translation table is provided for indicating the relationship. That is, the RBA from the CPU 10 is a logical address.

Figure 4:
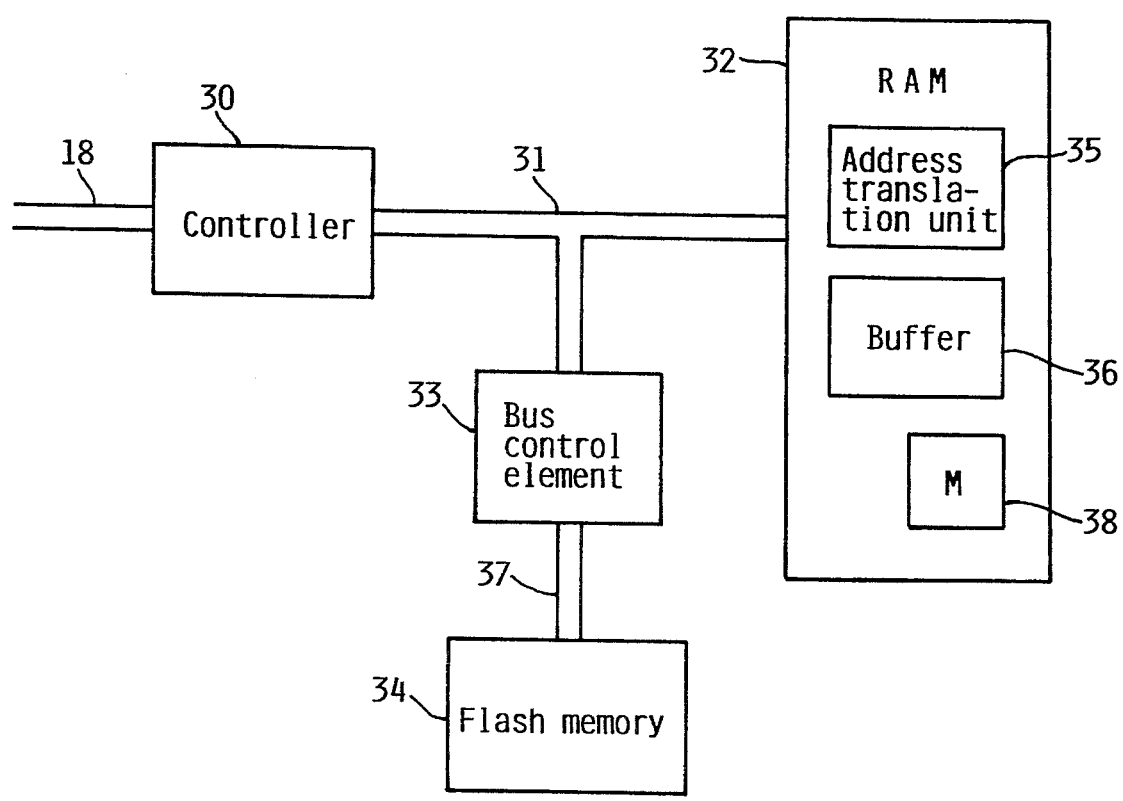
FIG. 4 is a diagram showing a schematic configuration of the solid state file apparatus.

FIG. 4 shows a schematic configuration of the SSF 20. The SSF 20 comprises a controller 30 connected to the family bus 18, and an internal bus 31 consisting of a random access memory (RAM) 32, a bus control element 33 and a flash memory 34. The RAM 32 includes an area 35 for storing the address translation table, and a buffer area 36. In addition, the RAM 32 includes an area for storing the maximum sequence number (M), which is described later. The bus control element 33 has the well-known receiver/driver configuration for interconnecting the internal bus 31 and a memory bus connected to the flash memory 34.

Figure 5:
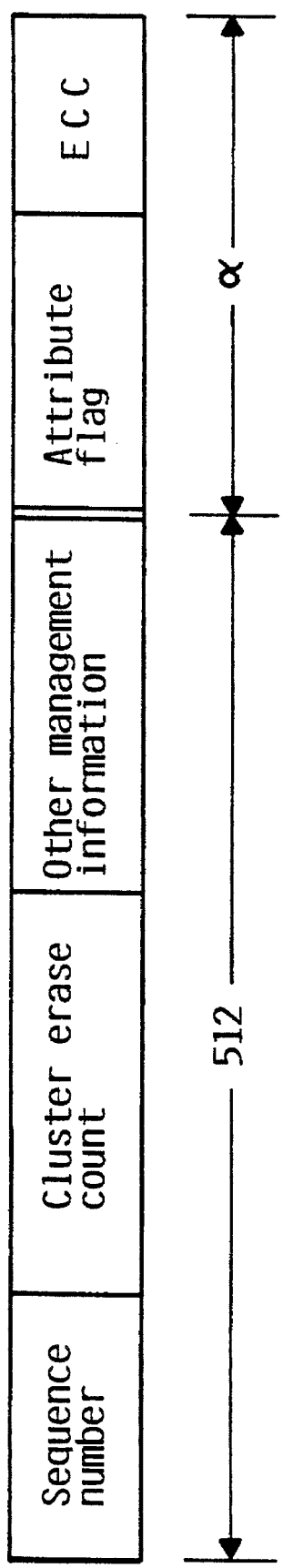
FIG. 5 is a diagram showing a configuration of a cluster information sector.
Figure 6:
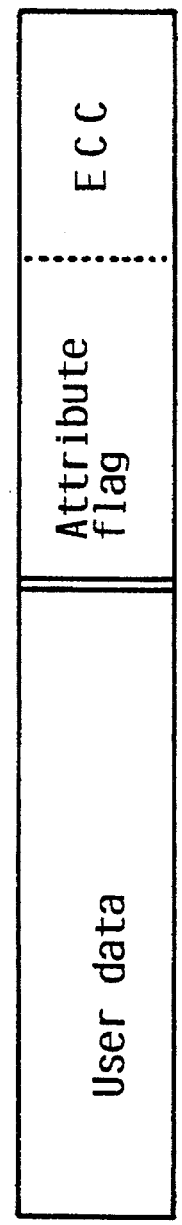
FIG. 6 is a diagram showing a configuration of a sector other than the cluster information sector (data sector)

In this embodiment, the sector size specified by the CPU 10 is 512 bytes, while the size of a physical sector, which is the minimum access unit of the CPU 10 to the SSF 20, is 512 bytes+$\alpha$ (see FIGS. 5 and 6). When a 16 Mbit flash memory is used, one physical sector uses two word lines in a flash EEPROM. That is, two pages constitute one sector. A sector (physical sector) of the SSF 20 is managed as follows.

1) A logical set is created for which actual erasure is performed, and which is called a cluster. The cluster consists of one or more blocks each of which is a physical erasure unit. In the embodiment, eight sectors constitute one block, and eight blocks constitute one cluster. Each cluster is provided with a cluster information sector which holds areas for the cluster erase count and sequence number. The cluster erase count and the sequence number are saved as part of the management information in the cluster information sector. In the embodiment, a sector positioned at the top physical address of each cluster is assigned to the cluster information sector.

FIG. 6 shows the configuration of sectors other than the cluster information sector of each cluster (hereinafter called "data sectors"). As shown, a data sector includes an area for storing an attribute and an error correction code (ECC) in addition to a data area for storing 512 byte user data.

Here, it should be noted that, unlike Japanese Pat. Appln. No. 3-197318, the sector does not have a status area in which the valid/invalid flag is set. The attribute commonly included in each sector is used for identifying whether or not the sector is the cluster information sector.

2) In the initialize process of the flash EEPROM in fabrication, an initial sequence number is provided for each cluster so that they do not overlap each other. It is preferable to provide such a condition that the sum of the erase count for all clusters equals the maximum sequence number.

Figure 7:
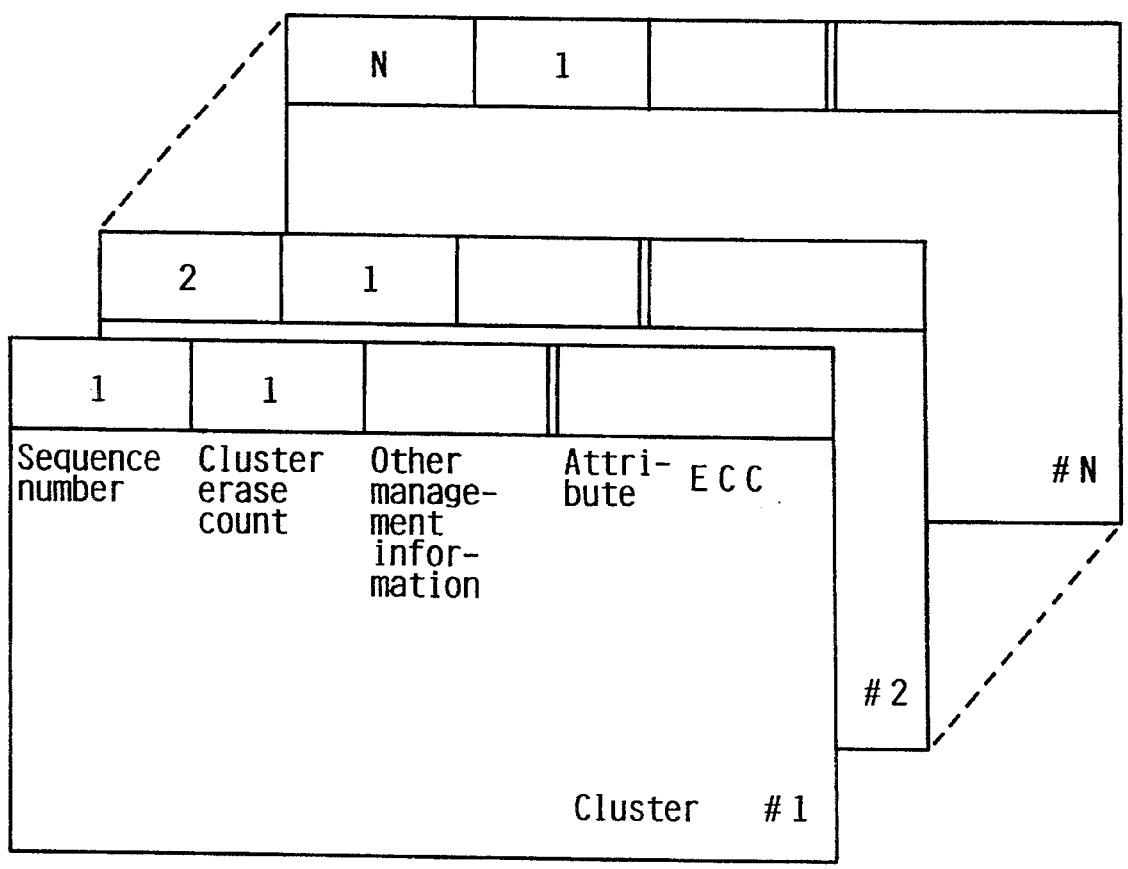
FIG. 7 is a diagram for setting of the initial value of the cluster information sector.

As shown in FIG. 7, it is assumed that the SSF has N clusters, and each cluster is assigned cluster numbers from 1 to N. (Actually, the cluster number is specified by the sum of high order bits.) An SSF initialization program executed by a computer in a plant sets the cluster erase count of each cluster to "1". At the same time, it writes "i" as the sequence number for a cluster at the cluster number i so that the sequence numbers do not overlap each other.

Although, in this example, 1 is given as the initial value of the cluster erase count, the present invention can be also implemented in a case where an actual erase count is written. In addition, although in this example the order of initial values of sequence numbers are matched to that of the cluster numbers, the present invention is not limited to such numbering system of the initial sequence number, but the initial sequence numbers may be given regardless of the cluster number.

The condition necessary to determine the validity or invalidity of a sector is that the sequence numbers do not overlap with each other. In the embodiment, it is further established that the maximum value of sequence number (maximum sequence number) equals the sum of the erase counts of each cluster. The above two conditions should be satisfied at any time during operation of the SSD, except for when a cluster is being erased. In the example shown in FIG. 7, the sum of cluster erase counts is N and the maximum value of sequence number is also N so that the conditions are satisfied.

If, in the example of FIG. 7, the cluster erase count of cluster N is 2 and that of other clusters is 1, the above two conditions will be satisfied by assigning the sequence numbers 1 to N–1 to the clusters 1 to N–1, and the sequence number N+1 to the cluster N.

3) The operation of the controller 30 in erasing a cluster (FIG. 4) will be explained by referring to FIG. 8. First, a cluster to be erased is determined. Although there are various methods, it is usual to determine a cluster as the one to be erased when the number of valid sectors for that cluster gets below a fixed value (step 80). If the cluster to be erased is X, the controller copies the valid data of X to a data sector in another cluster (step 81).

To execute steps 80 and 81, it is necessary to determine the validity or invalidity of sectors. It is sufficient to reference the entry in the address translation table pointed by the reverse pointer of a given sector, and to check whether or not the address written in that entry matches the address of that sector. If so, the sector is valid, otherwise it is invalid. Step 81 detects valid sectors in such a manner. In addition, it checks the number of valid and invalid sectors once, records the result in a table (not shown) provided in the RAM 32 (FIG. 4), and updates the table every time subsequent writing is performed. Then, a cluster to be erased can be determined by regularly referencing the table.

Next, the controller copies the cluster information sector of the cluster X into another suitable cluster or a nonvolatile storage area such as a RAM with battery backup to save the current sequence number and erase count of the cluster X (step 82). Then, the cluster X is erased (step 83). If it is necessary to initialize an erased cluster, that is, if there is no cluster with completely blank data sector, it is immediately initialized (step 85). Otherwise, the SSF performs a normal operation (Step 86). Initialization as referred to here means to write a sequence number in the erased cluster so as to enable the data sector to be written into.

The operation of the controller 30 (FIG. 4) in initializing the erased cluster will be explained by referring to FIG. 9. First, the controller selects the one with the minimum cluster erase count from one or more which have been erased but not yet initialized (step 90). The selected cluster is called C.

Next, the current maximum sequence number M is found, and a value M+1 (M added with 1 thereto) is written as the sequence number of the cluster C in the cluster information sector of that cluster (step 91). In this case, because the maximum sequence number M is stored in the area 38 of the RAM 32, it is accessed. In step 92, the value M+1 is written in the area 38.

Thereafter, in step 93, the erase count stored in step 82 is read when erasing the cluster C, and a value added with 1 thereto is written in the cluster information sector of the cluster C. The cluster management information saved when erasing the cluster C is written as it is as that other than the sequence number, the cluster erase count, and ECC.

Figure 8:
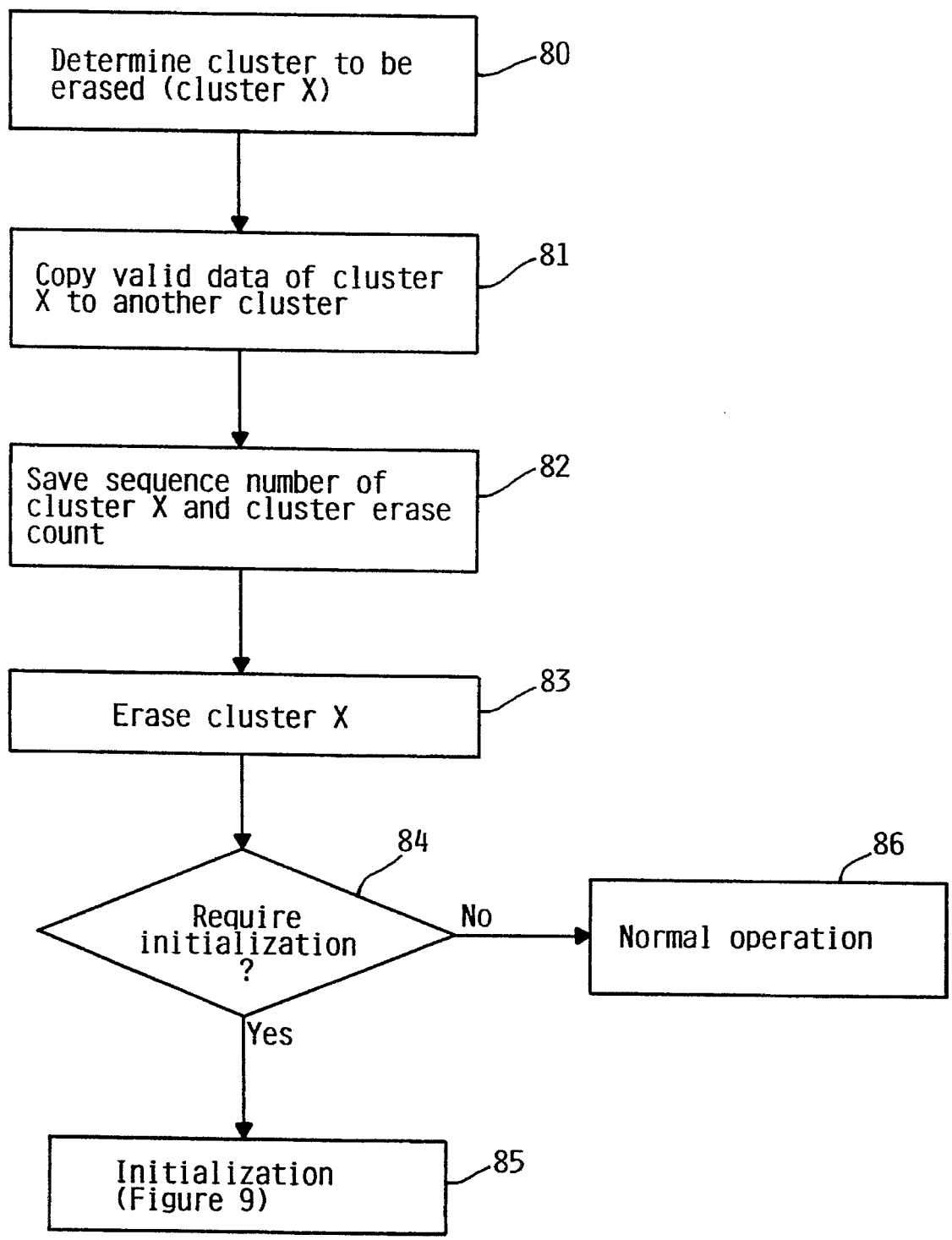
FIG. 8 is a flowchart showing an operation of a controller in erasing a cluster.
Figure 9:
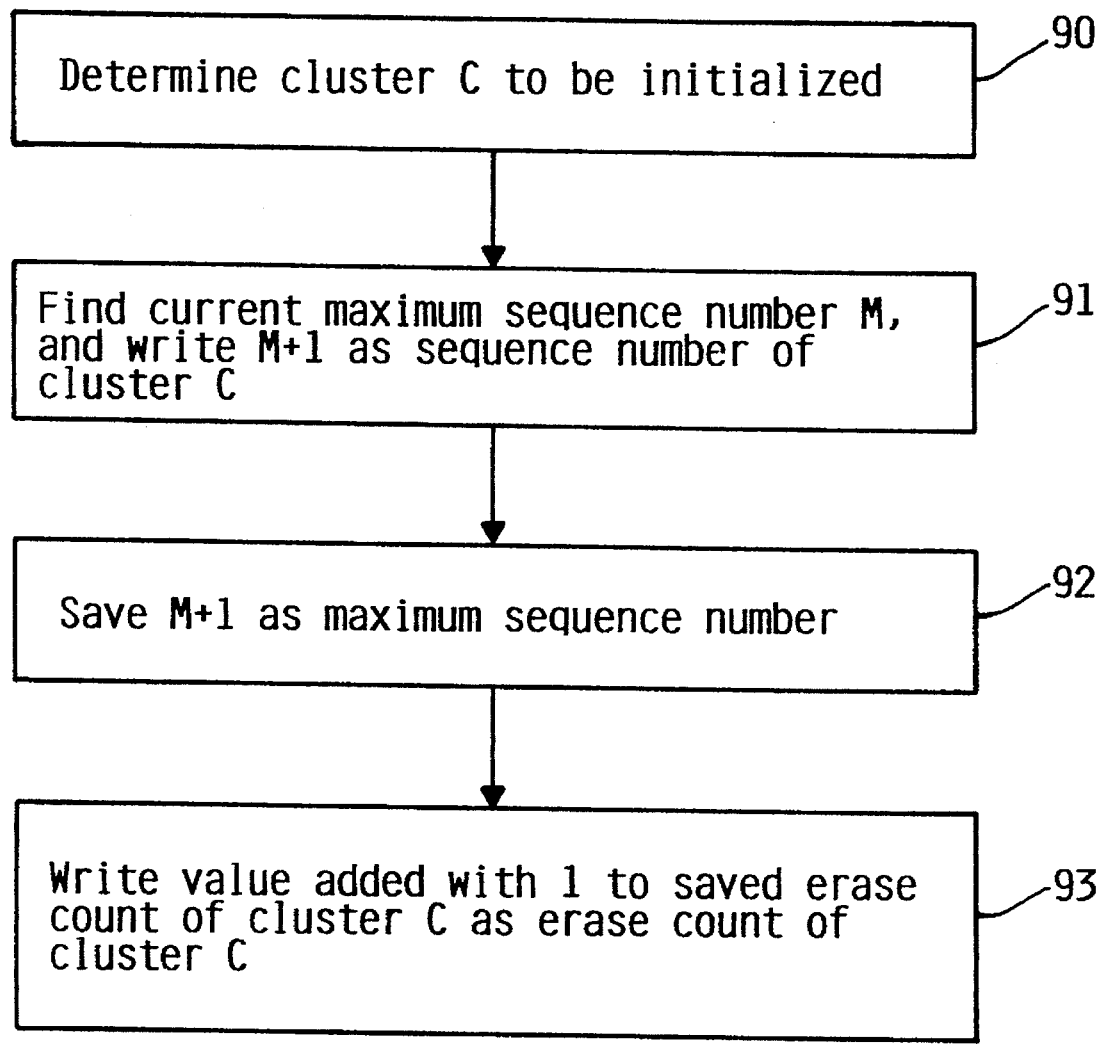
FIG. 9 is a flowchart showing an operation of the controller in initializing an erased cluster.

The control flow shown in FIGS. 8 and 9 is merely an example, and can be modified in various manners. For example, an erased cluster may be immediately initialized. In such a case, the process immediately Jumps from step 83 of FIG. 8 to step 91 of FIG. 9. Then, the cluster erase count and the sequence number of the erased cluster, as well as the maximum sequence number saved in the RAM vary as follows.

|  | Value prior to erasure | Value after initialization |
| --- | --- | --- |
| Cluster erase count | E | E + 1 |
| Sequence number | S | M + 1 |
| Maximum sequence number | M | M + 1 |

In the above example, a value added with 1 to the current maximum sequence number is written in the cluster information sector. In short, it is sufficient to write a value larger than the current maximum sequence number M and it is not necessary to limit the increment to one.

4) Writing into a sector uses a dynamic allocation method. However, unlike Japanese Pat. Appln. No. 3-197318, it does not set valid/invalid flags. Sectors in the same cluster are written in ascending or descending order of address. In the embodiment, because the cluster information sector is placed at the top of the cluster, data is written into the sector in ascending order of address, but, if it is placed at the end of a cluster, data is written in the sector in descending order of address.

Until writing is complete for one cluster, that is, until all the sectors in the cluster are used, or it is decided that the rest of the cluster is to be left unused, data is not written into other clusters. If all sectors within a cluster are bad, writing of data is terminated therein. Such termination can be determined because bad sector information is previously written in a part of the flash memory 34 in the initialize process in SSF fabrication.

Initially, user data is written into the cluster according to the initial sequence number assign in 2), but, once data is written into all the clusters, writing is performed in the cluster with the maximum sequence number through the erasure and initialization processes.

Generally, it is easy to distinguish valid sectors from invalid sectors if the sequence of all sectors in time order can be determined. However, it is practically impossible to write time sequence information in all the clusters because area overhead of the information is too large. The present invention maintains this time sequence information by two-level hierarchies, the cluster and the sector. Clusters are sequenced by sequence numbers in cluster information sectors due to the erasure method described in 3). Sectors are sequenced by the locations where they are in their clusters due to the write method described in 4). By combining them, the sequence of all sectors in temporal order can be uniquely determined and the area overhead of the temporal information becomes very small.

5) At the time when the system is powered-up, the address translation table is reconstructed while determining the validity or invalidity of sectors with the sequence number in the cluster and the location of sectors in the cluster. If there are a plurality of physical sectors for a specific logical sector, it is judged that the one in the cluster with the greatest sequence number is valid. If two or more physical sectors exist for one logical sector, a valid sector for the logical sector is settled by the time series information.

Two methods are possible to attain the above. The first method is that which first sorts the sequence numbers and then scans the clusters in the sorted order. The second method is that which creates a sequence number table in a RAM. The former is fast and advantageous in various aspects once the sorting is complete. However, all the sequence numbers must be read prior to the sorting. Therefore, the cluster management information is read twice. Furthermore, because a large work area is generally required to perform sorting at high speed, the cost of the SSF may be increased depending on the status.

Figure 10:
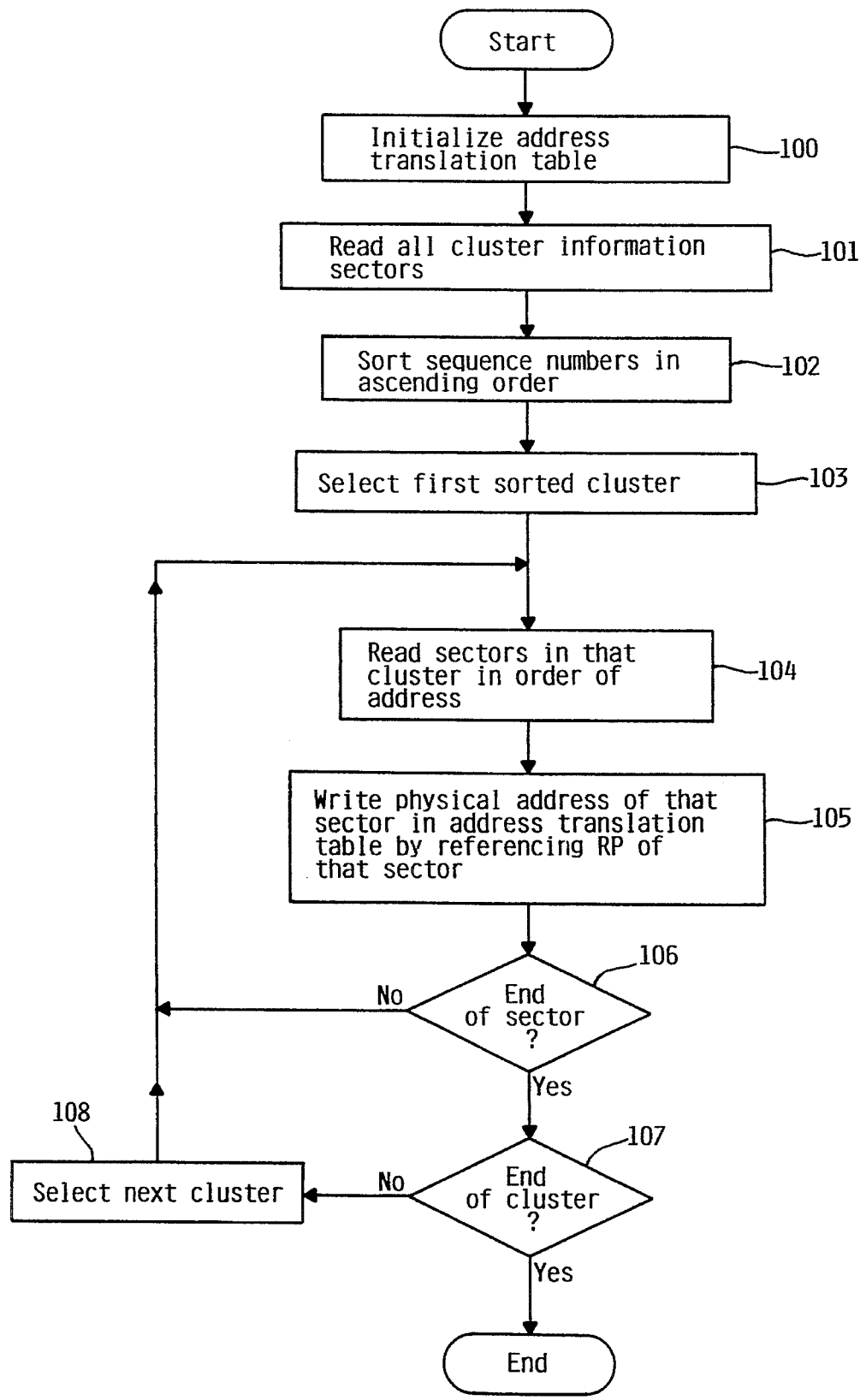
FIG. 10 is a flowchart showing an example of operation of the controller in reconstructing the address translation table.

The process flow of the first method will be explained by referring to FIG. 10. First, the area of the address translation table is held in the RAM so as to initialize the value of each entry at a specific value (for example, 0) (step 100). Then, all cluster information sectors are read and sorted in the ascending order of sequence number (steps 101 and 102). Thereafter, clusters are selected from the lowest sequence number, and the sectors in the selected cluster are read in the order of address. In the embodiment, the sectors are sequentially read from the cluster information sector in ascending order of address. The physical address of that cluster is written in the entry of the address translation table pointed by the reverse pointer of the read sector. Even if an address of another sector has been written in the entry, the address of the sector just read is written (steps 103–108).

Figure 11:
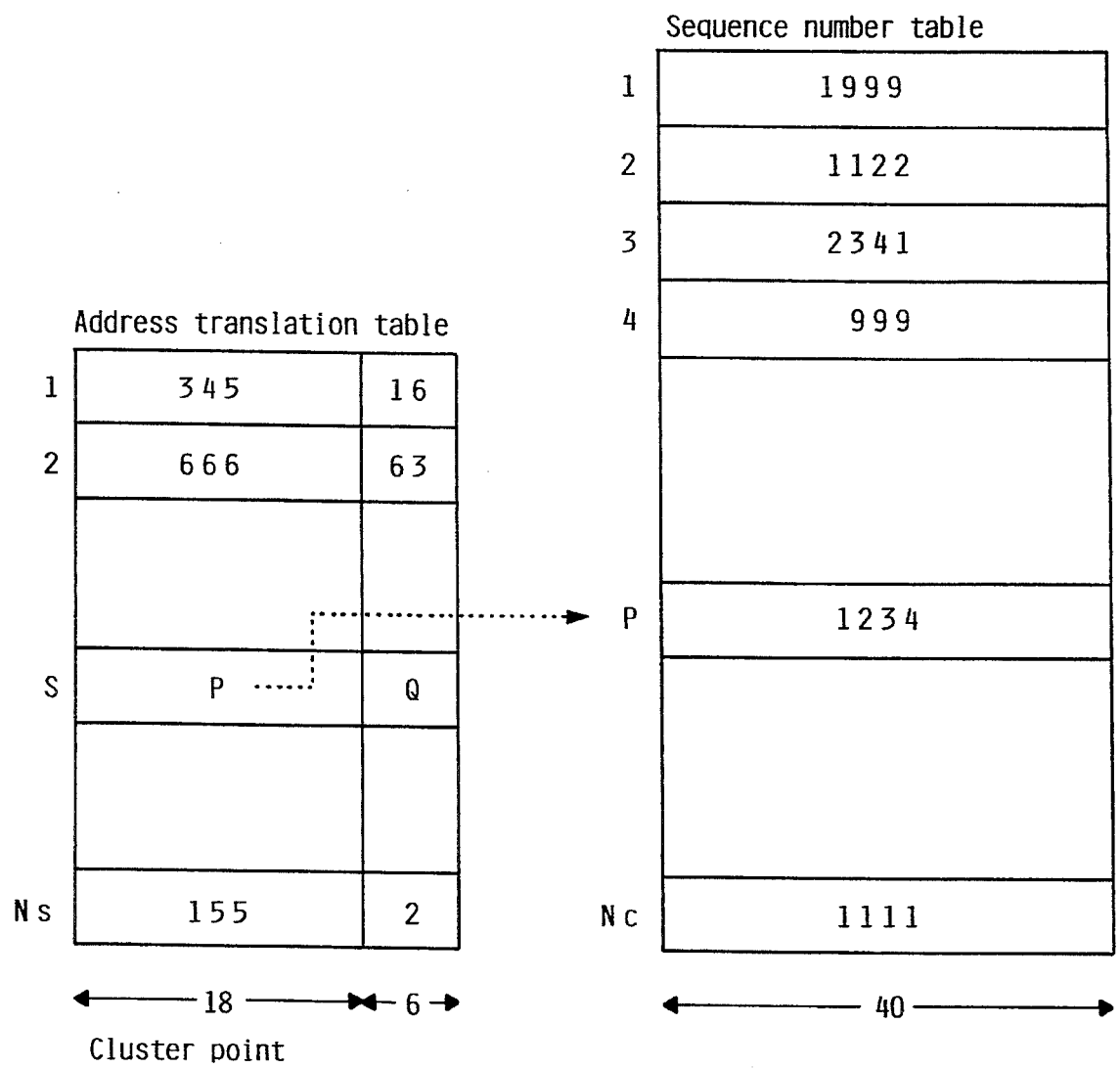
FIG. 11 is a diagram showing a relationship between an address translation table and a sequence number table.

The sequence number table used for the second method will be explained by referring to FIG. 11. In this method, a sequence number table storing the sequence number of N-th cluster in the N-th entry is created in the RAM 32 (FIG. 4). When a 40 Mbit SSF is assumed to have 64 sectors per cluster, the number of clusters is 1280, excluding redundant areas, and the area for the sequence number table is about 6 Kbytes, assuming one entry of the sequence number table being 5 bytes. In addition, although the address translation table is in the RAM when using the dynamic sector allocation method, the upper 18 bits of the value for each entry of the table excluding the lower six bits correspond to the cluster number (hereinafter the upper 18 bits are called the "cluster pointer"). Now, if the cluster pointer for the S-th sector contains P, it is possible to determine the sequence number of the cluster in which the S-th sector exists by reading the P-th entry of the sequence number table. In the example of FIG. 11, the address translation table indicates that the entity of the logical sector S exists in the Q-th sector of the cluster P, and the sequence number table indicates that the sequence number of the cluster P is 1234. In FIG. 11, Ns is the sum of the logical sectors, and Nc is the sum of the clusters.

Figure 12A:
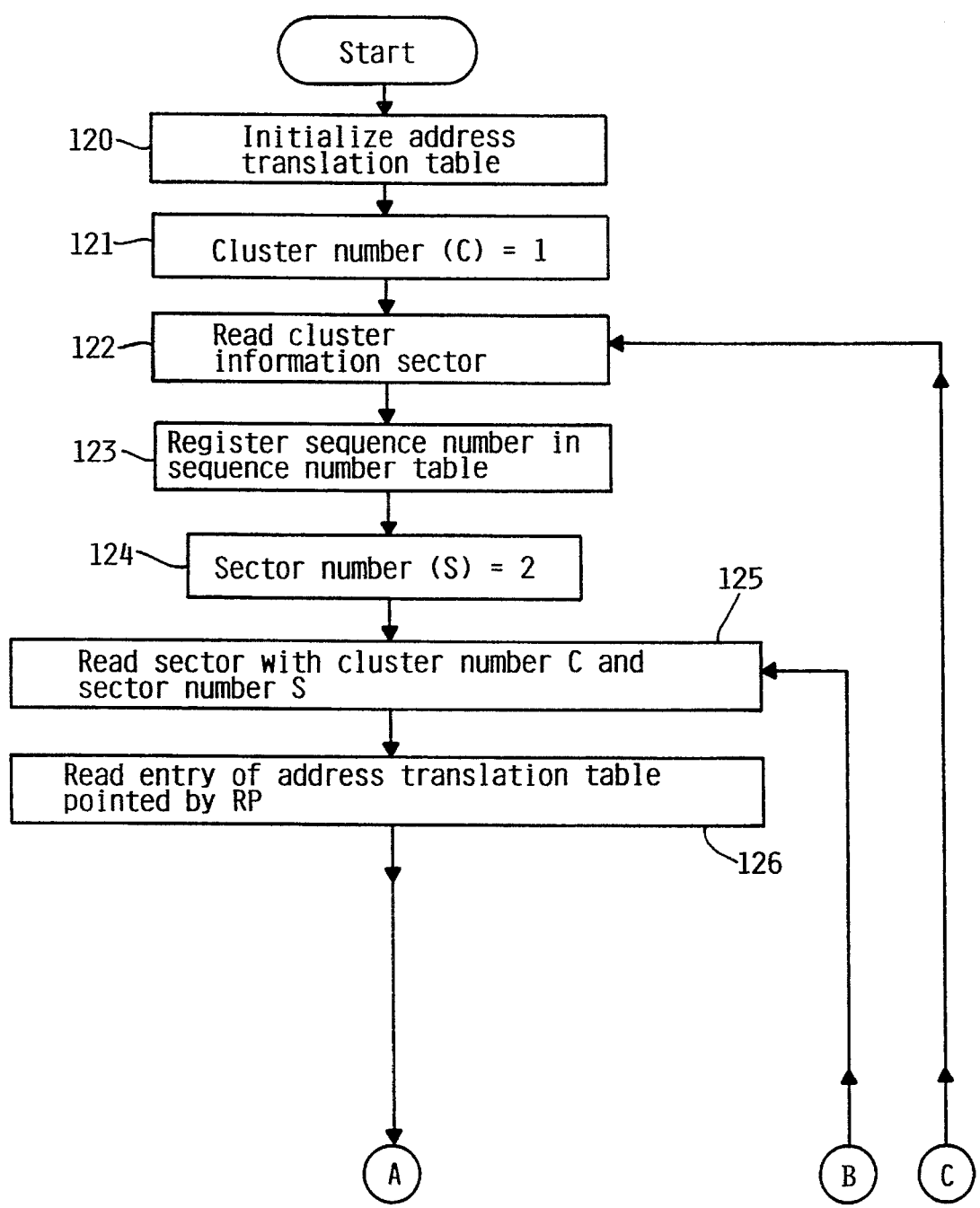
FIG. 12 is a flowchart showing an example of operation of the controller in reconstructing the address translation table.
Figure 12B:
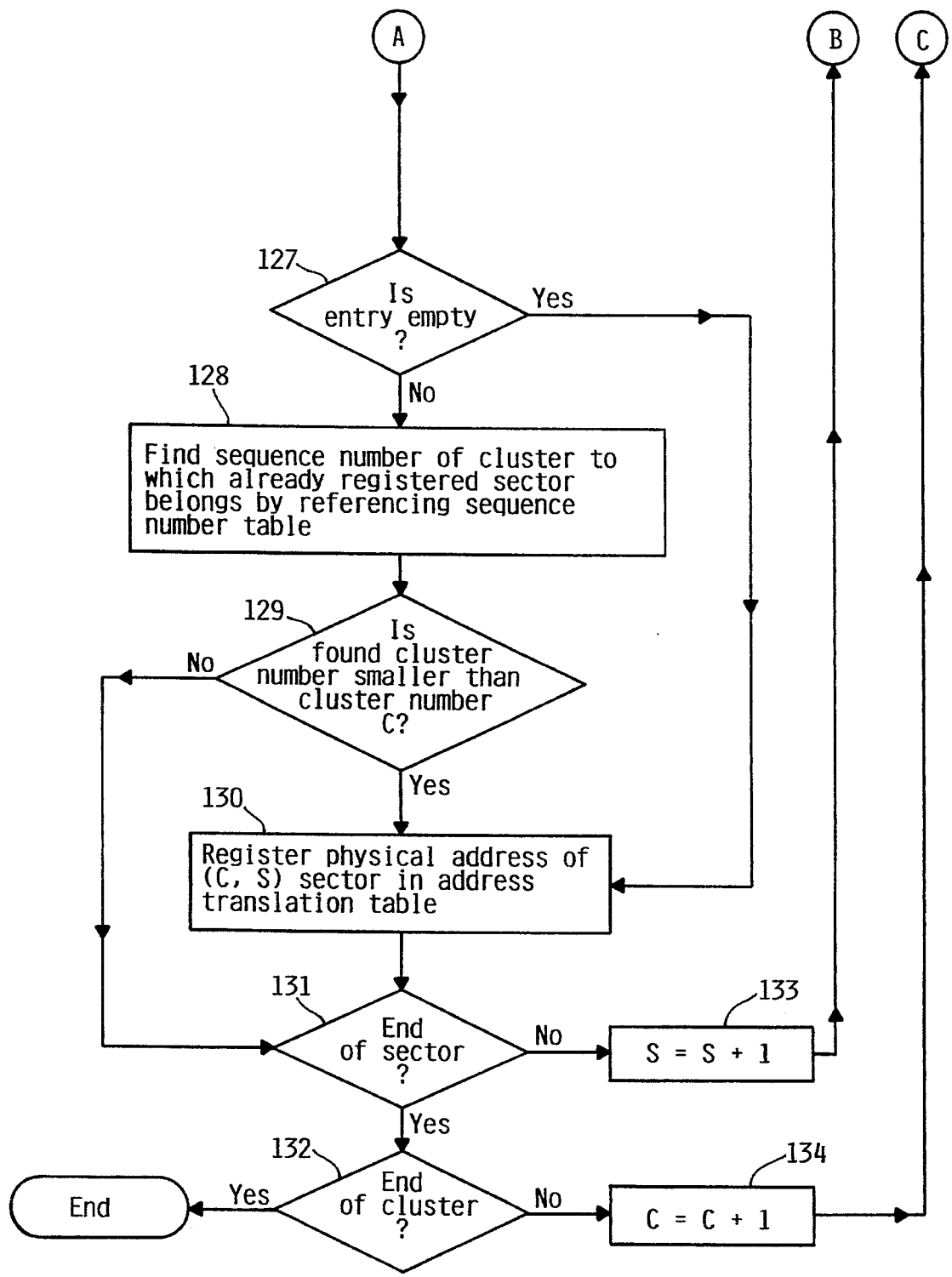

The process flow of the second method will be explained by referring to FIG. 12.

A] First, the area of the address translation table is held in the RAM so as to initialize the value of each entry to a specific value (for example, 0) (step 120). Then, a cluster is selected, and the sequence number of that cluster is registered in the sequence number table. Although, in the embodiment, the cluster is selected in ascending order of cluster number, it may be selected in any desired order (steps 121, 122, 123, and 134). If the selected cluster is called C, the sectors are scanned in the cluster C in the time sequence order so as to read the reverse pointer in the RP area of each sector (step 124, 125, and 133).

B] The address translation table is reconstructed from the reverse pointers according to the method of Japanese Pat. Appln. No. 3-197318. In this case, the operation depends on whether or not a physical address of another sector has been written in the entry of the address translation table pointed by the reverse pointer (steps 126 and 127).

* If that entry is empty

The physical address of the sector S read in step 125 is written into the entry (step 130).

* If that entry is not empty

The sequence number table is searched for by the cluster pointer of the entry so as to find the sequence number of the cluster to which the sector S already registered in the entry belongs (step 128). This is compared with the sequence number of the cluster C being currently read for the value (step 129). If the former is smaller, the address of the sector S is written in the entry (step 130). Otherwise, the operation maintains the pointer as it is because the registered sector is still valid.

C] Only valid sectors are registered in the address translation table by repeating the above procedure for all clusters and sectors (steps 131 and 132).

After the reconstruction of the address translation table, the controller 30 (FIG. 4) saves the maximum sequence number in the work area of the RAM 32 and releases the area for the sequence number table. As described earlier, the maximum sequence number is required for initializing an erased cluster.

The controller 30 further compares the sum of the sequence number of all clusters with the maximum sequence number by utilizing the fact that the cluster information sectors of all clusters are read in reconstructing the address translation table. If they are not matched, it means that data integrity is questionable so that the controller 30 requests the CPU 10 (FIG. 3) to display an error message on the display device According to the present invention, an invalid sector can be distinguished from a valid sector in the solid state file apparatus using a nonvolatile memory with cluster-erase flash capability without using an overwrite method.

What is claimed is:

1. A nonvolatile memory for cluster-erase flash, comprising:

a flash memory having N clusters each having M sectors, wherein M and N are integers greater than one;

each of said N clusters includes a cluster information sector, wherein one of said M sectors is said cluster information sector;

and said cluster information sector of each of said N clusters holds a sequence number, wherein no two of said cluster information sectors have the same sequence number.

2. The nonvolatile memory as claimed in claim 1, wherein said cluster information sector of each of said N clusters holds a cluster erase count, the sum of the cluster erase counts being equal to a maximum value of the sequence numbers.

3. A method for storing data within a nonvolatile memory for cluster-erase flash, wherein the nonvolatile memory comprises a flash memory having N clusters each having M sectors, wherein M and N are integers greater than one and each of said N clusters includes a cluster information sector, wherein one of said M sectors is said cluster information sector, wherein said cluster information sector of each of said N clusters holds a sequence number, wherein no two of said cluster information sectors have the same sequence number and there being a maximum sequence number, and comprising the steps of:

selecting a cluster to be written based on a cluster erase count contained in the cluster information sector; and writing data sequentially to the sectors within the selected cluster.

4. The method of claim 3 wherein the sum of said erase counts for all said N clusters equals said maximum sequence number.

5. The method of claim 3 wherein said flash memory is a NAND-type flash EEPROM.

6. The nonvolatile memory of claim 1 wherein each of said cluster information sectors further comprises:

a cluster erase count; and an attribute flag within said each cluster information sector for identifying each of said cluster information sectors as a cluster information sector.

7. A nonvolatile NAND-type flash EEPROM memory for cluster-erase flash, comprising:

a flash memory having N clusters, each cluster having M sectors, wherein M and N are integers greater than one and wherein at least one of said M sectors is a data sector;

each of said N clusters includes a cluster information sector wherein one of said M sectors is the cluster information sector;

said cluster information sector of each of said N clusters holds a sequence number, wherein no two of the cluster information sectors have the same sequence number and there being a maximum sequence number.

8. The nonvolatile memory of claim 7 wherein the sum of the cluster erase counts is equal to said maximum sequence number.

9. The nonvolatile memory of claim 7 wherein each of said data sectors further comprises an attribute flag which identifies said data sector as a data sector.

10. The nonvolatile memory of claim 1 wherein the nonvolatile memory comprises a NAND-type flash EEPROM.

* * * * *